(12) United States Patent
Komatsu

(10) Patent No.: US 6,417,565 B1
(45) Date of Patent: Jul. 9, 2002

(54) SEMICONDUCTOR DEVICE AND METHOD FOR PRODUCING SAME

(75) Inventor: Hiroshi Komatsu, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 09/413,193

(22) Filed: Oct. 5, 1999

(30) Foreign Application Priority Data

Oct. 8, 1998 (JP) .......................................... 10-287077
Aug. 2, 1999 (JP) .......................................... 11-219318

(51) Int. Cl.[7] .......................... H01L 23/48; H01L 23/52
(52) U.S. Cl. ...................... 257/750; 257/758; 257/774; 257/757
(58) Field of Search ................................ 257/750, 758, 257/774, 757, 761, 763, 764, 762; 438/118, 622, 629, 637, 639, 640, 667, 668, 672, 675, 700, 701, 713, 978, 650–652, 647–649, 656

(56) References Cited

U.S. PATENT DOCUMENTS 5,523,603 A * 6/1996 Fishbein et al. ............. 257/356
5,658,811 A * 8/1997 Kimura et al. .............. 438/289
5,952,701 A * 9/1999 Bulucea et al. ............. 257/407

* cited by examiner

*Primary Examiner*—Jasmine J B Clark
(74) *Attorney, Agent, or Firm*—Rader, Fishman & Grauer PLLC; Ronald P. Kananen, Esq.

(57) ABSTRACT

A semiconductor device having a substrate, an insulating film formed in the substrate, a conductive layer formed on the insulating film and having at least a part in contact with the insulating film made of a conductive material having a work function near a substantial center of an energy band gap of the substrate material and containing a predetermined amount of impurity, and a takeout electrode formed in the substrate and a method for producing the same.

21 Claims, 12 Drawing Sheets

DUAL GATE PROCESS
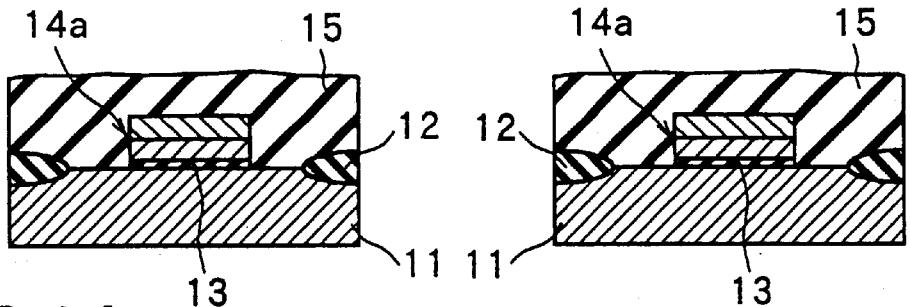
FIG.1A PRIOR ART
FIG.1B PRIOR ART
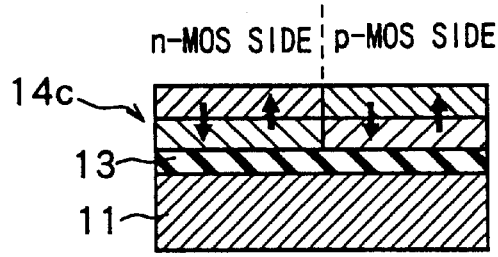
FIG.1C PRIOR ART
FIG.2 PRIOR ART
METAL SILICIDE SINGLE LAYER GATE
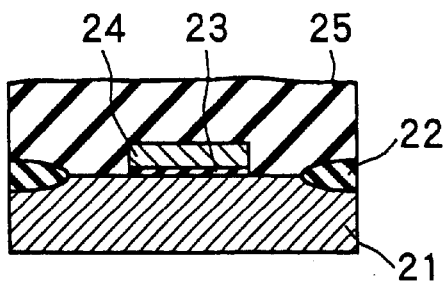

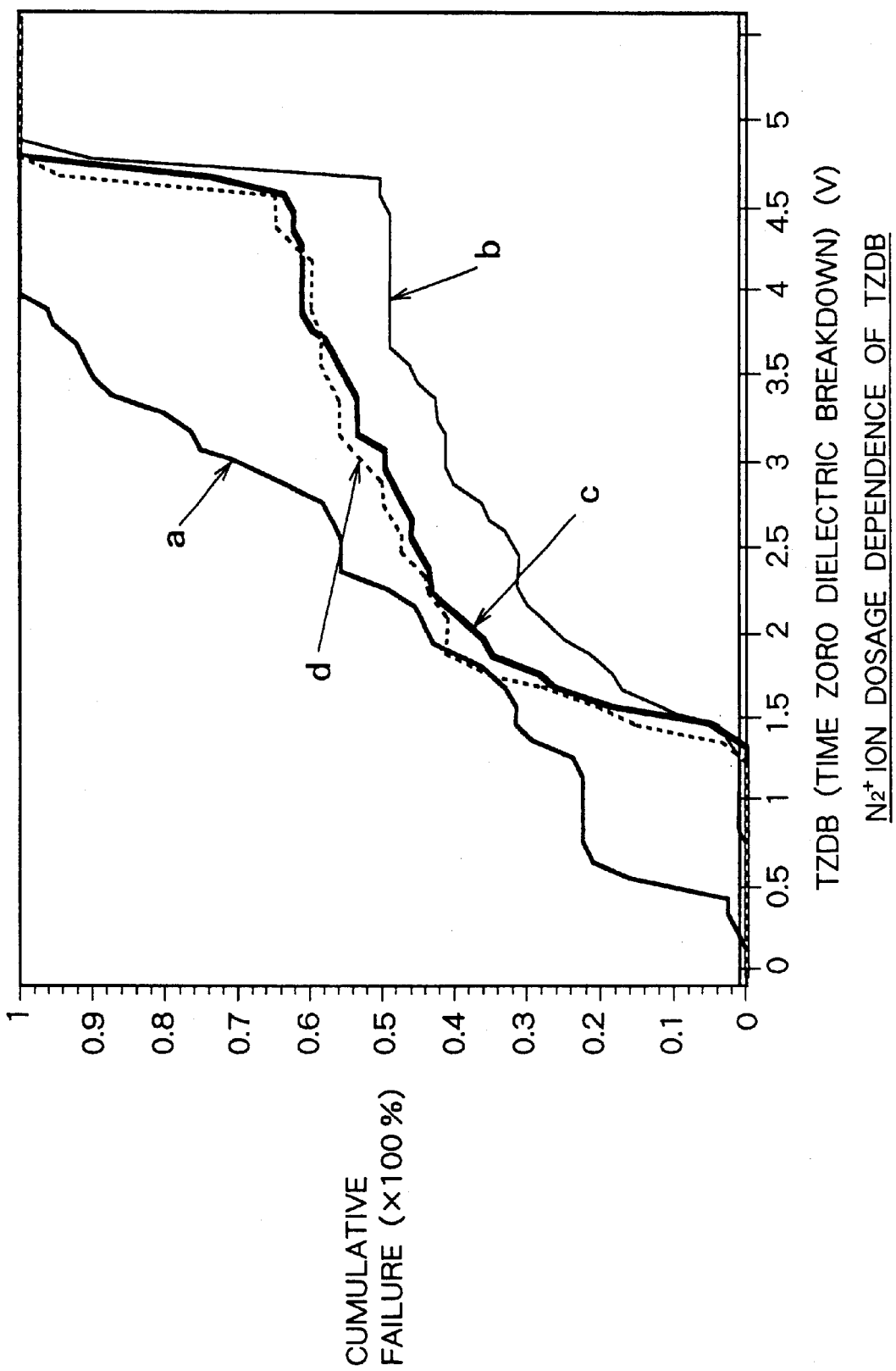

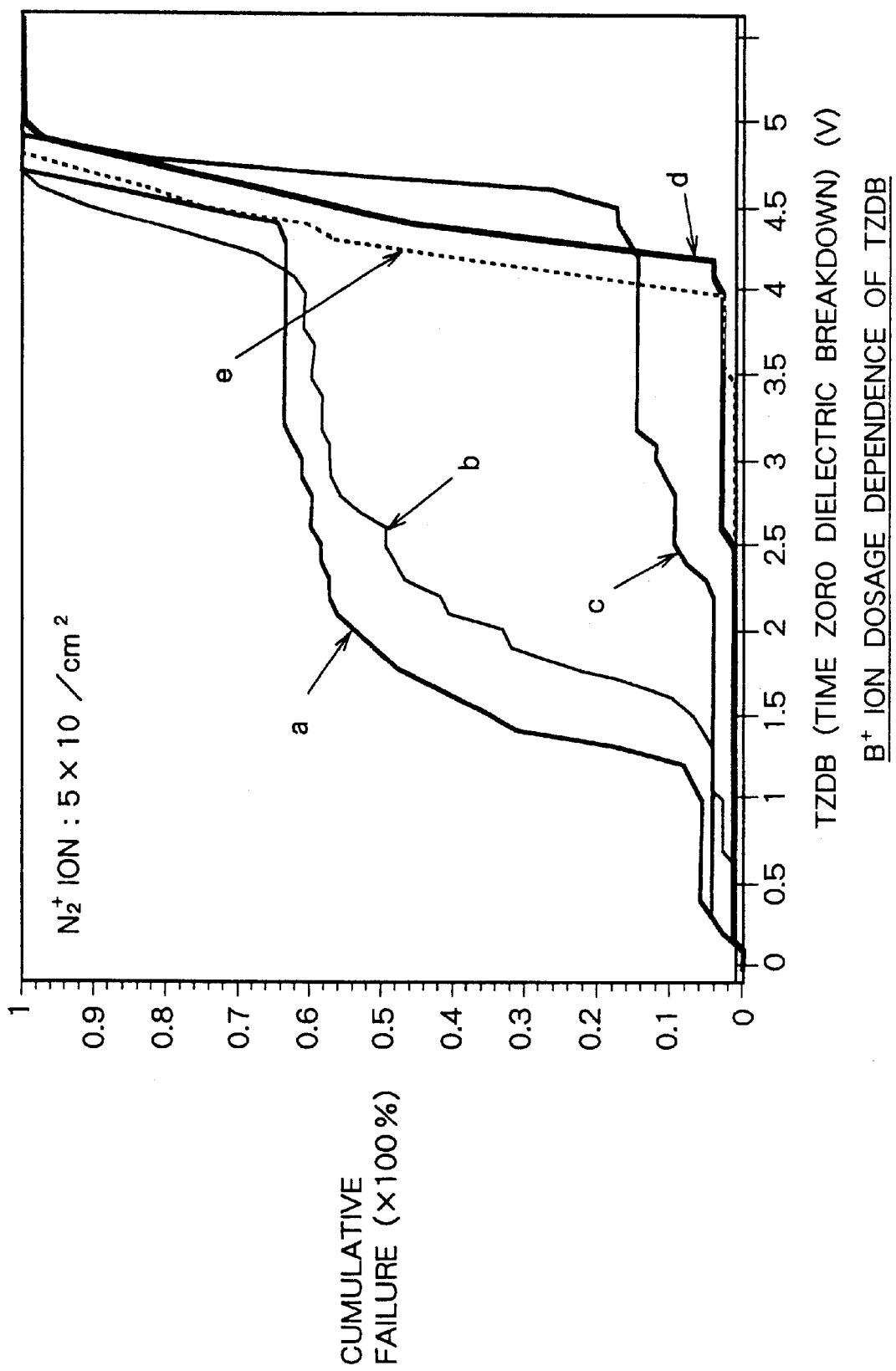

SEMICONDUCTOR DEVICE AND METHOD FOR PRODUCING SAME

BACKGROUND OF THE INVENTION

1. Field of the Invention

The present invention relates to a semiconductor device and a method for producing the same, more particularly relates to a semiconductor device having a conductive layer in which a work function of a conductive material located at a boundary with an insulating film formed on a substrate is controlled to near the substantial center of an energy band gap of a substrate material, that is, the "mid-gap", and to a method for producing the same.

2. Description of the Related Art

In semiconductor devices in recent years, complete separation among elements has become easy by using a silicon-on-insulator or semiconductor-on-insulator (SOI) substrate as the substrate. Further, it is known that, if such an SOI substrate is used, the control of the latchup and the software error peculiar to a complementary metal oxide semiconductor (MOS) transistor (CMOSTr) becomes possible, so studies have been conducted on the increase of speed and increase of reliability of large-scale integrated circuits (LSIs) comprised of CMOSTrs using SOI substrates having silicon (Si) active layers of a thickness of about 500 nm from a relatively early stage.

Further, recently, it has been learned that if the Si active layer of the SOI substrate surface is made further thinner to about 100 nm and the impurity concentration of a channel region is controlled to be relatively low to make substantially the entire Si active layer depleted (make it a full depletion type), excellent characteristics such as suppression of a short channel effect and improvement of a current driving capability of the MOSTr are obtained.

On the other hand, as a gate electrode material, polycrystalline silicon doped with an n-type impurity (n$^+$poly-Si) has been frequently used in the past. However, in order to set a threshold voltage (Vth) of an n-channel MOS transistor (NMOSTr) to near 0.5 to 1.0V of a usual enhancement type MOS transistor by using n$^+$poly-Si for the gate electrode material, it is necessary to control the impurity concentration of the channel region to about $10^{17}/cm^3$ or more.

Further, in order to prepare a full depletion type enhancement type MOSTr, the method has been studied of using a polycrystalline silicon doped with boron as a p-type impurity (p$^+$poly-Si) as the gate electrode material in place of the n$^+$poly-Si for the gate electrodes of the NMOSTr.

In this method of using p$^+$poly-Si for the gate electrodes of an NMOSTr, if the impurity is not included in the channel region (non-doped), Vth becomes substantially 1.0V. Further, where it is intended to make Vth a further lower value, it has been necessary to perform counter-doping to dope an n-type impurity, for example, phosphorus (P$^+$), in the channel region of the NMOSTr. However, when performing the counter-doping, the short channel effect is increased, so this is not preferred for a miniaturized LSI.

In this way, in any case of using n$^+$poly-Si and p$^+$poly-Si as the gate electrode material, in the preparation of a semiconductor device using an SOI substrate having a fine structure with a thin silicon active layer, it was extremely difficult to control the Vth of a full depletion type MOSTr to a suitable value of about 0.5V.

Further, even in the case of preparing a MOSTr with a channel region of a partial depletion type, careless increase of the impurity concentration of the channel region is not preferred in that it increases the drain leak current.

Further, semiconductor devices using bulk silicon substrates have been being miniatured as well. When using a bulk silicon substrate, it is not possible to form a surface channel type MOSTr resistant to a short channel effect simultaneously in both of the N-channel and the P-channel using only n$^+$poly-Si for the gate electrodes. Therefore, as shown in FIGS. 1A to 1C, a so-called dual gate process of using n$^+$poly-Si for the NMOSTrs (shown in FIG. 1A) and using p$^+$poly-Si for the p-channel MOS transistors (PMOSTr) (shown in FIG. 1B) has been studied for the purpose of adjustment of the Vth by using the work function of the gate electrodes.

However, in this dual gate process as well, when using poly-Si gate electrodes 14$a$ and 14$b$ of different types of dopants between the NMOSTr (shown in FIG. 1A) and the PMOSTr (shown in FIG. 1B), as shown in FIG. 1C, there is a problem that impurities in the gate electrodes diffuse into each other (indicated by arrows in the figure) in parts at which the n$^+$poly-Si gates of the NMOSTr and the p$^+$poly-Si gates of the PMOSTr are connected and that the work functions of the gate electrodes largely fluctuate.

This problem becomes particularly conspicuous when a silicide is further formed at an upper layer of the poly-Si to be made to tungsten polycide (W-polycide) in order to lower the resistance of the gate electrodes formed by the dual gate process, as shown in FIGS. 1A to 1C, since the diffusion coefficient of the dopant in the tungsten silicide (WSi$_x$) is extremely large.

Note that, in FIGS. 1A to 1C, 11 denotes a silicon substrate, 12 a field oxide film, 13 a gate insulating film, 14$a$ a gate electrode of a NMOS transistor, 14$b$ a gate electrode of a PMOS transistor, 14$c$ a junction portion of the gate electrodes of the NMOS transistor side and the PMOS transistor side, and 15 an inter-layer insulating film.

In this way, even in a case where a SOI substrate is used and even in a case where a bulk silicon substrate is used, in order to deal with the miniaturization of semiconductor devices in the future, there is a problem with usage of different types of poly-Si for the gate electrode material. In place of this, it has been considered necessary to use a gate electrode material having a work function near the mid-gap.

The energy band of the semiconductor has a structure where an electronically filled band (a filled band or a valence band) and an empty band (conduction band) are separated by a prohibit band, and in the present invention, a gate electrode material having a work function near the mid-gap means a conductive material which has a work function (energy difference between a vacuum level and a Fermi level) almost the same as that near the center (near mid-gap) of the width of this prohibit band (band gap).

Summarizing the problem to be solved by the invention, among the gate electrode materials having a work function near this mid-gap, refractory metal silicide or refractory metal does not directly react with the SiO$_2$ and does not cause conspicuous deterioration of the gate withstand voltage, so attracts attention as particularly preferred material and has been studied as gate electrode material.

However, as shown in FIG. 2, when a gate insulating film 23 is formed on a silicon substrate 21 and a gate electrode is further formed on this by a single layer film 24 made of WSi$_x$ or another refractory metal silicide, there is the problem that a reduction of the gate insulation withstand voltage or a reduction of a gate capacity occurs in comparison with the case of the related art where a gate electrode such as poly-Si (or W-polycide) is used. Note that, in FIG. 2, 21 denotes a silicon substrate, 22 a field oxide film, 23 a gate insulating film, 24 a gate electrode made of a single $WSi_x$ layer, and 25 an inter-layer insulating film.

The reduction of the gate insulation withstand voltage is not preferred for a next generation device which is further miniaturized and where the gate oxide film is made further thinner. Further, the reduction of the gate capacity invites a reduction of the drive capability of the transistors etc. and as a result ends up lowering the operating speed of the device.

SUMMARY OF THE INVENTION

An object of the present invention is to provide a semiconductor device having a conductive layer, preferably a gate electrode, using a conductive material having a work function near the mid-gap of the energy band gap of the substrate material, preferably silicon, at least in the vicinity of the boundary with an insulating film, preferably gate oxide film, formed on the substrate, not causing deterioration of the insulation withstand voltage of the insulating film formed on the substrate, not causing a reduction of the capacity (gate capacity) of the conductive layer after formation, and maintaining the operating speed of the device and a method for producing the semiconductor device.

The present inventor discovered the fact that the reduction of the gate insulation withstand voltage and the reduction of the gate capacity in the case of forming the gate electrodes by a single layer film made of $WSi_x$ or another refractory metal silicide were due to the heat treatment step performed after the gate electrodes were formed and to the As and other impurities being taken into the $WSi_x$ or other refractory metal silicide and resulting growth of the grain of the $WSi_x$ or other refractory metal silicide.

Accordingly, if the growth of the grain of the $WSi_x$ or other refractory metal silicide can be suppressed by a certain method, it can be expected that a gate electrode can be obtained in which the short channel effect is suppressed and the operating speed of the device is maintained without adding any change to conditions of the heat treatment step or step for doping the impurity and without inviting a reduction of the gate insulation withstand voltage or a reduction of the gate capacity.

The present inventor engaged in intensive studies and as a result discovered that by using refractory metal silicide, refractory metal or other conductive materials having a work function near the mid-gap of the energy band gap of the substrate material (silicon) and causing doping of a certain type of impurity into the conductive material, it is possible to suppress the grain growth of the conductive material and thereby completed the present invention.

Namely, the present invention provides a semiconductor device comprising a substrate, an insulating film formed in the substrate, a conductive layer formed on the insulating film and having at least a part in contact with the insulating film made of a conductive material having a work function near a substantial center of an energy band gap of the substrate material, and a takeout electrode formed in the substrate, characterized in that the conductive material contains a predetermined amount of impurity.

In the semiconductor device of the first aspect of the invention, the impurity is preferably an impurity suppressing the grain growth of the conductive material. As the impurity, more concretely, oxygen, nitrogen, boron, etc. is more preferably used.

Alternatively, the conductive layer preferably has a conductive material containing impurity having different concentrations in a depth direction (perpendicular direction with respect to the substrate) and having a work function near the substantial center of the energy band gap of the substrate material, for example, a refractory metal silicide layer or a refractory metal layer, more preferably has a conductive material with a center region with respect to a depth direction thereof containing an impurity having a higher concentration than those of upper and lower regions thereof having the work function near the substantial center of the energy band gap of a substrate material, for example, a refractory metal silicide layer or a refractory metal layer.

Alternatively, more preferably, the conductive layer contains two or more types of impurities. Preferably, at least one of the two or more types of impurities is oxygen, nitrogen, or boron. Each of the two or more types of impurities further preferably are contained in a concentration of $1 \times 10^{19}/cm^3$ to $1 \times 10^{21}/cm^3$.

Further, the substrate material is preferably silicon, and the conductive material is preferably a refractory metal silicide or a refractory metal.

As the refractory metal silicide, one, two or more types selected from a group consisting of tungsten silicide ($WSi_x$), molybdenum silicide ($MoSi_x$), tantalum silicide ($TaSi_x$), and titanium silicide ($TiSi_x$) can be exemplified.

As the refractory metal, one, two or more types selected from a group consisting of tungsten (W), tantalum (Ta), and titanium (Ti) can be exemplified.

Further, as the takeout electrode, for example, a source and a drain formed on the substrate can be mentioned.

The present invention provides, second, a semiconductor device comprising a silicon substrate, a gate insulating film formed in the silicon substrate, a gate electrode formed on the gate insulating film and having at least a part in contact with the gate insulating film made of a refractory metal silicide layer containing an impurity or a refractory metal layer containing an impurity, and a takeout electrode formed in the silicon substrate. The second aspect of the invention more concretely specifies the semiconductor device of the first aspect of the invention.

In the second aspect of the invention, as the silicon substrate, an n-type silicon semiconductor substrate, a p-type silicon semiconductor substrate, an SOI substrate, etc. can be used.

The present invention provides, third, a method for producing a semiconductor device comprising steps of forming an insulating film in a substrate, forming a conductive layer made of a conductive material having a work function near a substantive center of an energy band gap of the substrate material on the insulating film, doping an impurity into the conductive layer, and forming a takeout electrode in the substrate.

In the third aspect of the invention, the step of doping the impurity into the conductive layer preferably has a step of doping the impurity into the conductive layer by an ion implantation process, a step of doping a impurity suppressing a grain growth of the conductive layer into the conductive layer by the ion implantation process and/or a step of forming the conductive film containing the impurity on the insulating film by a chemical vapor deposition process (CVD process).

Further, the step of doping the impurity into the conductive layer preferably has a step of doping the impurity so that an impurity concentration varies in a depth direction and more preferably has a step of doping the impurity into the conductive layer so that a concentration of the impurity contained in a center region thereof with respect to a depth direction thereof becomes higher than impurity concentrations of upper and lower regions thereof.

More concretely, the step of doping the impurity into the conductive layer preferably has a step of doping oxygen, nitrogen, or boron into the conductive layer.

Further, the step for doping the impurity into the conductive layer preferably has a step of doping two or more types of impurities into the conductive layer and, in this case, more preferably, has a step of doping at least oxygen, nitrogen, or boron into the conductive layer and further preferably has a step of doping each of the two or more types of impurities into the conductive layer with the concentration of $1 \times 10^{19}/cm^3$ to $1 \times 10^{21}/cm^3$.

In the third aspect of the invention, as the substrate, preferably a silicon substrate such as a p-type silicon semiconductor substrate, n-type silicon semiconductor substrate, or SOI substrate is used.

The step of forming the conductive layer made of the conductive material having the work function near the substantive center of the energy band gap of the substrate material preferably has a step of forming a refractory metal silicide layer or a refractory metal layer on the substrate.

The step of forming the refractory metal silicide layer preferably has a step of forming a layer made of one, two or more types selected from a group consisting of tungsten silicide ($WSi_x$), molybdenum silicide ($MoSi_x$), tantalum silicide ($TaSi_x$), and titanium silicide ($TiSi_x$).

Further, the step of forming the refractory metal layer preferably has a step of forming a layer made of one, two or more types selected from a group consisting of tungsten (W), tantalum (Ta), and titanium (Ti).

Further, the present invention provides, fourth, a method for producing a semiconductor device comprising steps of forming a gate insulating film in a silicon substrate, forming a conductive layer made of a conductive material having a work function of a substantial center of an energy band gap of the silicon on the gate insulating film, doping an impurity into the conductive layer, forming a gate electrode by processing the conductive layer, and forming a takeout electrode in the silicon substrate. The fourth aspect of the invention more concretely specifies the invention of the method of production of the third aspect of the invention and is the method for producing a semiconductor device according to the second aspect of the invention.

In the fourth aspect of the invention, as the silicon substrate, a p-type silicon semiconductor substrate, n-type silicon semiconductor substrate, SOI substrate, etc. can be preferably used.

The semiconductor devices of the first and second aspects of the invention are characterized in that at least a part of a conductive layer, preferably gate electrode, in contact with the insulating film, preferably gate insulating film, is made of a conductive material having a work function near the substantive center of the energy band gap of the substrate material, preferably refractory metal suicide or refractory metal, and the conductive material contains an impurity.

Accordingly, the semiconductor devices of the first and second aspects of the invention are semiconductor devices having conductive layers (gate electrodes) in which a so-called short channel effect is suppressed and the operating speed of the device is maintained. In addition, they are semiconductor devices in which the dielectric breakdown of the insulating film of the lower layer accompanied with grain growth of the refractory metal silicide or the refractory metal or other conductive material or in a MOSTr the insulating film (gate insulating film) dielectric breakdown and the reduction of the gate capacity, which had become a problem of the related art, are suppressed.

Further, when the conductive material of the conductive layer of the semiconductor device of the present invention contains two or more types of impurities, in comparison with a case where one type of impurity is doped, it is possible to more effectively suppress the grain growth of the conductive layer. Accordingly, even in a case where a thinner insulating film, for example a gate insulating film having a thickness of about 4 nm, is formed, the semiconductor devices having a conductive layer, that is, gate electrodes, excellent in a reliability without causing deterioration of the insulation withstand voltage are provided.

Further, according to the method of production of the semiconductor devices of the third and fourth aspects of the invention, a semiconductor device can be produced having a conductive layer, that is, gate electrodes, in which the short channel effect is suppressed and the operating speed of the device is maintained without adding any change to the conditions of the heat treatment step and the step of doping the impurity after this and without causing a reduction of the insulation withstand voltage and the reduction of the gate capacity.

Further, by doping the impurity nonuniformly in the depth direction of the conductive layer, preferably so that the center portion with respect to the depth direction of the conductive layer has a relatively high concentration and the upper and lower regions thereof have a relatively low concentration, a MOSTr having insulating film boundary surface characteristics similar to those of the case where the impurity is not doped can be formed. Accordingly, according to the methods of production of a semiconductor device of the present invention, the degree of freedom of process design of the semiconductor device is not lowered.

Further, when there is the step of doping the impurity into the conductive layer by the ion implantation process, the impurity can be ion implanted with a correctly controlled acceleration energy and dosage.

Accordingly, according to the present invention, the degree of integration of the LSI can be improved, the drive capability of the MOSTr can be improved according to the design rule, and high speed operation of the device becomes possible.

BRIEF DESCRIPTION OF THE DRAWINGS

These and other objects and features of the present invention will become clearer from the following description of the preferred embodiments given with reference to the accompanying drawings, in which:

FIGS. 1A to 1C are conceptual views for explaining the problem of the dual gate process in the related art;

FIG. 2 is a conceptual view for explaining the problem where a gate electrode made of a single layer of a refractory metal silicide of the related art is formed;

FIG. 12 is a view of results of an evaluation test of the gate withstand voltage characteristics (TZDB: Time Zero Dielectric Breakdown) In a case where a gate insulating film is formed on a silicon substrate and a gate electrode made of a $WSi_x$ film containing various concentrations of nitrogen is further formed thereon, in which an ordinate represents a cumulative failure rate, and an abscissa represents a gate withstand voltage; and FIG. 13 is a view of results of an evaluation test of the gate withstand voltage characteristics (TZDB) in a case where a gate insulating film is formed on a silicon substrate and a gate electrode made of a $WSi_x$ film containing a predetermined concentration of nitrogen and various concentrations of boron is further formed thereon, in which an ordinate represents the cumulative failure rate, and an abscissa represents the gate withstand voltage.

DESCRIPTION OF THE PREFERRED EMBODIMENTS

Figure 3A:
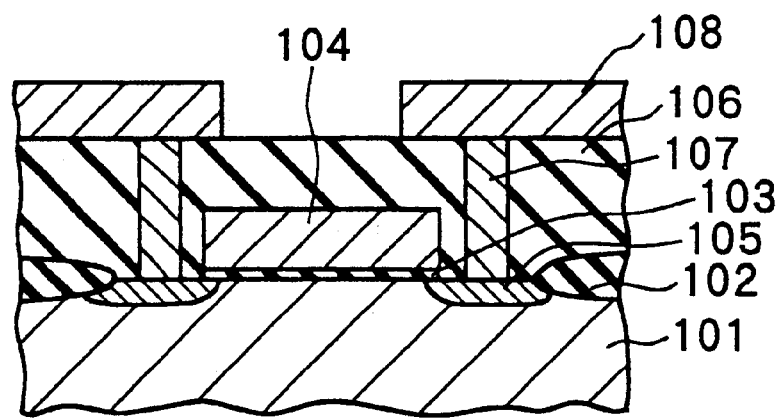
FIGS. 3A to 3B are sectional views of the structure of a region in which a MOS transistor of a semiconductor device of the present invention is formed.

Below, embodiments of the present invention will be explained by referring to the drawings.

First Embodiment

The first embodiment is a semiconductor device having a p-channel MOS transistor as shown in FIG. 3A.

The semiconductor device shown in FIG. 3A has a gate oxide film 103 made of silicon oxide on a region of an n-type silicon semiconductor substrate 101 sectioned by a field oxide film 102 and further has a gate electrode having a single layer structure made of a $WSi_x$ (tungsten silicide) film 104 having a thickness of about 100 nm on this gate oxide film 103.

Further, an impurity diffusion region (source and drain region) doped with the p-type impurity is formed in a peripheral area below a gate electrode of the n-type silicon semiconductor substrate 101 and electrically connected to an interconnection layer 108 via connection plugs 107. The upper portion of the gate electrode has a structure covered by an inter-layer insulating film 106.

The $WSi_x$ film 104 of the gate electrode of this semiconductor device contains oxygen in a dosage of $5\times10^{14}/cm^2$ (about $5\times10^{19}/cm^3$ in concentration). As a result, the grain size of the $WSi_x$ film 104 is suppressed to a size of about 20 nm at the maximum even after heat treatment at for example 850° C. for 30 minutes.

Accordingly, the semiconductor device of the present embodiment is a semiconductor device having a MOS transistor with a high reliability in which the short channel effect is suppressed without causing a reduction of the insulation withstand voltage and the reduction of the gate capacity and by which the operating speed of the device is maintained.

Second Embodiment

Figure 3B:
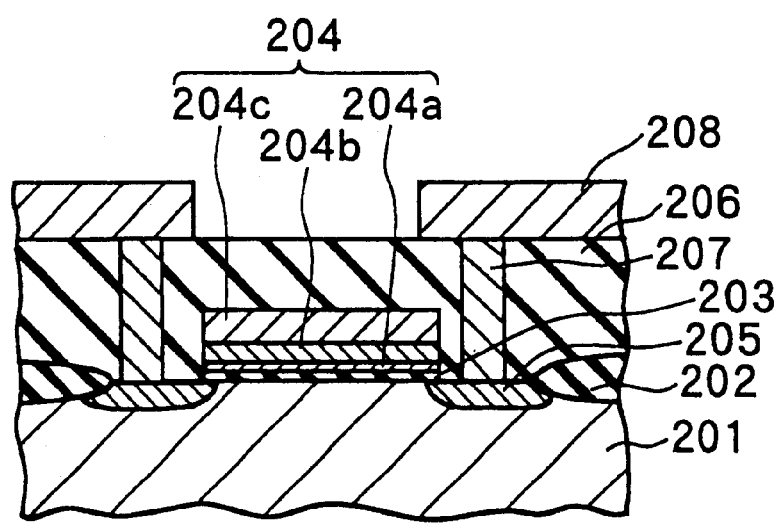

The second embodiment is a semiconductor device having an n-channel MOS transistor as shown in FIG. 3B. The semiconductor device shown in FIG. 3B has substantially the same structure as that of the semiconductor device shown in the first embodiment. The gate electrode is formed by a single $WSi_x$ film layer 204 containing oxygen as an impurity.

In this semiconductor device, the oxygen concentration in the $WSi_x$ film 204 is changed with respect to the depth direction. Namely, the $WSi_x$ film 204 has a structure where the oxygen concentration is sufficiently low (about $10^{17}/cm^3$ or less) in the boundary surface region with a gate oxide film 203 ($WSi_x$ film 204a: region with a thickness of about 10 nm from the gate oxide film 203 side), then the oxygen concentration becomes for example about $5\times10^{19}/cm^3$ in the center region ($WSi_x$ film 204b: region with a thickness of about 30 nm from 204a side), and further the oxygen concentration becomes about $1\times10^{17}/cm^3$ or less in the region above the former ($WSi_x$ film 204c: region with a thickness of about 60 nm from 204b side).

By forming the gate electrode of the semiconductor device of the present embodiment by such a structure, it becomes possible to suppress the grain growth of the $WSi_x$ film 204a in the vicinity in contact with at least the gate oxide film 203 of the $WSi_x$ film 204 while holding the boundary surface characteristic between the $WSi_x$ film 204 and the underlying gate oxide film 203.

Namely, in the center region ($WSi_x$ film 204b) in which the oxygen concentration is relatively high, i.e., about $5\times10^{19}/cm^3$, the grain growth of the $WSi_x$ is obstructed due to the influence of this oxygen. Also, in the $WSi_x$ film 204a of the part (lower region) in contact with the gate oxide film having a relatively low oxygen concentration, the grain growth is suppressed due to the restriction of the grain growth in the depth direction thereof.

Further, the region with the thickness of 60 nm of the $WSi_x$ film 204c located in the uppermost layer (upper region) of the gate electrode, the impurity concentration of the oxygen is also relatively low (it is not necessary to raise the oxygen concentration) and the thickness is relatively large, so the grains are relatively large and grow to the size of about 50 nm, but the growth of the $WSi_x$ film 204c does not assist the deterioration of the gate insulation withstand voltage and the reduction of the gate capacity and contribute to only the reduction of the resistance of the gate electrode.

Accordingly, the semiconductor device of the present embodiment is a semiconductor device having a MOS transistor with an extremely high reliability in which the short channel effect is suppressed, the operating speed of the device is maintained, and gate insulating film dielectric breakdown and the reduction of the gate capacity are further suppressed.

Third Embodiment

The third embodiment is a semiconductor device having a similar structure to that of the semiconductor device of the first embodiment (illustration is omitted for convenience). The gate electrode of this semiconductor device is made of a single layer of a $WSi_x$ film doped with nitrogen in a dosage of $5\times10^{15}/cm^2$ ($5\times10^{20}/cm^3$ in terms of concentration) in place of oxygen.

In this case as well, the grain size of the $WSi_x$ film is a size within about 20 nm even after heat treatment at for example 850° C. for 30 minutes.

Accordingly, the semiconductor device of the present embodiment is a semiconductor device having a MOS transistor with an extremely high reliability in which the short channel effect is suppressed, the operating speed of the device is maintained, and gate insulating film dielectric breakdown and the reduction of the gate capacity are further suppressed.

Fourth Embodiment

Figure 4A:
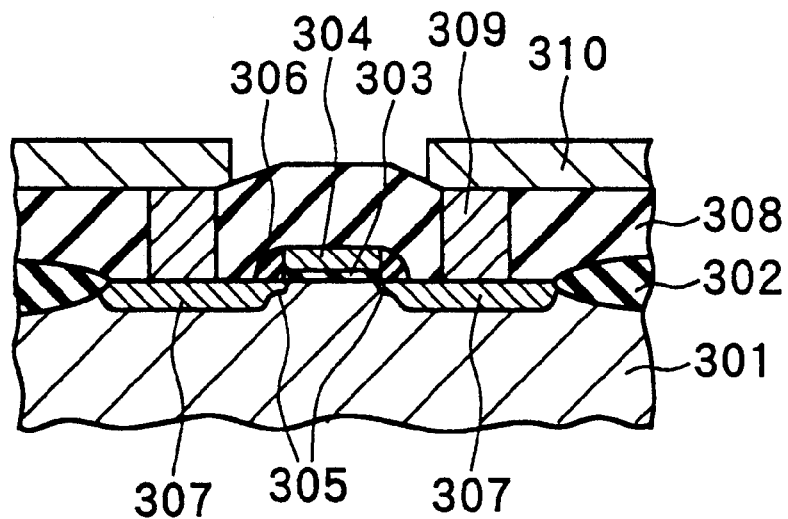
FIGS. 4A to 4B are sectional views of the structure of a region in which a MOS transistor of a semiconductor device of the present invention is formed.

The fourth embodiment is a semiconductor device having an n-channel MOS transistor as shown in FIG. 4A.

The semiconductor device shown in FIG. 4A has a gate oxide film 303 made of silicon oxide on a region of a p-type silicon semiconductor substrate 301 sectioned by a field oxide film 302 and further has a gate electrode having a single layer structure of a $WSi_x$ (tungsten silicide) film 304 having a thickness of about 100 nm on this gate oxide film 303.

This semiconductor device has a lightly doped drain (LDD) structure in which a side wall protection film 306 is formed on a side wall portion of the gate electrode, an n⁺impurity diffusion region (source and drain region) 307 doped with an n-type impurity is formed in a peripheral area below the side wall protection film 306 of the p-type silicon semiconductor substrate 301, and further an impurity ⁻ diffusion region 305 is formed in the channel region adjoining the n⁺impurity diffusion region. For this reason, the influence upon the source end is suppressed by having the drain field absorbed into the ⁻ impurity diffusion region 305 and the field intensity is reduced.

Further, the n⁺ impurity diffusion region 307 is electrically connected to an interconnection layer 310 via connection plugs 309. The upper portion of the gate electrode has a structure covered by an inter-layer insulating film 308.

In the $WSi_x$ film 304 of the gate electrode of this semiconductor device, nitrogen in a dosage of $5 \times 10^{15}/cm^2$ (about $5 \times 10^{20}/cm^3$ in concentration) and boron in a dosage of $5 \times 10^{15}/cm^2$ (about $5 \times 10^{21}/cm^3$ in concentration) are simultaneously doped.

As a result, the grain size of the $WSi_x$ film 304 becomes a size within about 15 nm even after heat treatment at for example 850° C. for 30 minutes. The grain growth of the $WSi_x$ film is further suppressed from that of the case where only nitrogen is doped.

Accordingly, the semiconductor device of the present embodiment is a semiconductor device having a MOS transistor with an extremely high reliability in which gate insulating film dielectric breakdown and the reduction of the gate capacity are further suppressed.

Fifth Embodiment

The fifth embodiment is a semiconductor device having an n-channel MOS transistor having a similar structure to that of the semiconductor device of the second embodiment (the illustration is omitted for convenience).

The gate electrode of this semiconductor device has a gate electrode made of a single layer structure of a $WSi_x$ film having a thickness of about 100 nm containing nitrogen and boron as impurities. The $WSi_x$ film uniformly contains the boron in a concentration of about $1 \times 10^{19}/cm^3$ and contains the nitrogen in varied concentrations thereof with respect to the depth direction.

Namely, this $WSi_x$ film has a structure in which the nitrogen concentration is sufficiently low (about $10^{19}/cm^3$ or less) in the surface boundary region with the gate oxide film (first region with a thickness of about 10 nm from the gate oxide film side), then the nitrogen is contained with a concentration of for example about $1 \times 10^{21}/cm^3$ in the center region (second region with a thickness of about 30 nm from the first region side), and further the oxygen is contained so that the concentration becomes about $1 \times 10^{19}/cm^3$ or less in the region above this (third region with a thickness of about 60 nm from the second region side).

By forming the gate electrode of the semiconductor device of the present embodiment with such a structure, it becomes possible to suppress the grain growth of the $WSi_x$ film of the first region in the vicinity in contact with the gate oxide film while holding an excellent surface boundary characteristic between the $WSi_x$ film and the gate oxide film of the underlying layer.

Namely, in the center region (second region) in which the nitrogen concentration is relatively high, i.e., $1 \times 10^{21}/cm^3$, the grain growth of the $WSi_x$ is obstructed due to the influence of the nitrogen and boron. Also, in the $WSi_x$ film of the part (first region) in contact with the gate oxide film in which the nitrogen concentration is relatively low, the grain growth is suppressed due to the restriction of the grain growth in its thickness direction.

Further, in the region with a thickness of 60 nm of the $WSi_x$ film located in the uppermost layer (third region) of the gate electrode, the impurity concentration of the nitrogen is also relatively low (it is not necessary to raise the nitrogen concentration) and the film substrate is relatively thick, therefore the grains grow relatively large (about 30 nm), but the growth of the $WSi_x$ film in this third region does not assist the deterioration of the gate insulation withstand voltage and the reduction of the gate capacity and only contributes to the reduction of the resistance of the gate electrode.

Accordingly, the semiconductor device of the present embodiment is one having a MOS transistor with an extremely high reliability in which the gate insulating film dielectric breakdown and the reduction of the gate capacity are further suppressed.

In the first to fifth embodiments explained above, the present invention was explained by taking as an example a semiconductor device having a gate electrode made of a single $WSi_x$ film. The semiconductor device of the present invention is not limited to this, however. The gate electrode thereof may be formed by another refractory metal silicide, for example, molybdenum silicide ($MoSi_x$), tantalum silicide ($TaSi_x$), or titanium silicide ($TiSi_x$), a refractory metal, for example, tungsten (W), tantalum (Ta), or titanium (Ti), or another conductive material.

Sixth Embodiment

Further, it is possible even if the gate electrode is formed by a laminate of a refractory metal silicide or refractory metal and conductive polycrystalline silicon layer doped with a p-type impurity or n-type impurity. The sixth embodiment is a semiconductor device having such a gate electrode.

Figure 4B:
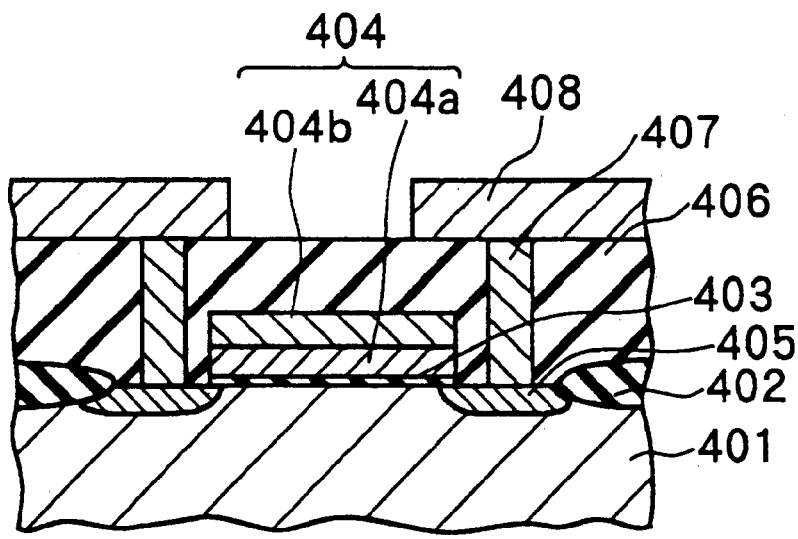

The semiconductor device shown in FIG. 4B has a gate oxide film 403 made of silicon oxide on a region of an n-type silicon semiconductor substrate 401 sectioned by a field oxide film 402 and further has a gate electrode having a dual layer structure comprising a $WSi_x$ film 404a having a thickness of about 60 nm on this gate oxide film 403 and a conductive polycrystalline silicon layer 404b on the $WSi_x$ film 404a.

Further, in the peripheral region below the gate electrodes of the n-type silicon semiconductor substrate 401, an impurity diffusion region (source and drain region) 405 doped with the p-type impurity is formed and electrically connected to an interconnection layer 408 via connection plugs 407. The upper portion of the gate electrode has a structure covered by an inter-layer insulating film 406.

The $WSi_x$ film 404a of the gate electrode of this semiconductor device is formed in contact with the top of the gate insulating film 403 and contains oxygen in a dosage of $5 \times 10^{14}/cm^2$ (about $5 \times 10^{19}/cm^3$ in concentration). As a result, the grain size of the $WSi_x$ film 404a is suppressed to a size of about 20 nm at the maximum even after heat treatment at for example 850° C. for 30 minutes.

Accordingly, in the semiconductor device of the present embodiment as well, a semiconductor device having a MOS transistor with a high reliability in which the short channel effect is suppressed and the operating speed of the device is maintained without inviting a reduction of the insulation withstand voltage and a reduction of the gate capacity is obtained.

In the sixth embodiment, an explanation was made by taking as an example a semiconductor device having a gate electrode of a laminate structure of a $WSi_x$ film and conductive polycrystalline silicon, but it may also be formed by a laminate of a refractory metal silicide or refractory metal other than $WSi_x$ and the conductive polycrystalline silicon. Note that the boundary part with at least the gate insulating film must be formed by a conductive material having a work function of the substantive center of the mid-gap of the substrate material.

Further, in the first to sixth embodiments, the explanation was made by taking as an example a semiconductor device in which the conductive layer was the gate electrode formed on the gate insulating film, but it may also be a semiconductor device in which the conductive layer is a MOS capacitor of a similar structure other than this or a semiconductor device in which a conductive layer doped with an impurity is used for the electrodes of the MOSTr MOS capacitor formed on a p-well or an n-well provided on the silicon semiconductor substrate.

Further, in the first to sixth embodiments, a bulk silicon substrate (n-type silicon semiconductor substrate) was used as the substrate, but it may also be a bulk silicon substrate (p-type silicon semiconductor substrate) or substrate of an SOI structure.

Next, the method for producing the semiconductor device will be explained in detail.

Note that the thickness of the conductive layer ($WSi_x$ film), the dosage of impurity suppressing the grain growth, implantation conditions, conditions of heat treatment, etc. in the following embodiments are only examples thereof and that the design can be appropriately changed according to the semiconductor device to be formed.

Seventh Embodiment

The seventh embodiment is a method for producing a semiconductor device of the first embodiment. FIG. 5A to FIG. 5D and FIG. 6A to FIG. 6D show the steps of production of the MOSTr produced according to the present embodiment.

Figure 5A:
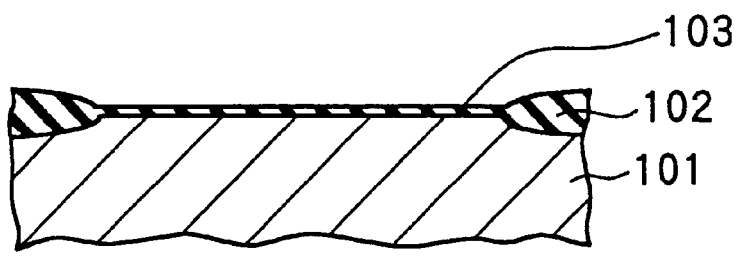
FIGS. 5A to 5D are sectional views of principal steps of a method for producing a semiconductor device of the present invention.

First, an explanation will be made of the steps up to FIG. 5A. On the p-type silicon semiconductor substrate 101, the field oxide film 102 is formed to a thickness of about 400 nm by the local-oxidation-of-silicon (LOCOS) process for wet oxidation at for example 950° C.

Next, the ions for the threshold voltage (Vth) are implanted in a surface layer portion of the active region serving as the source and drain region and the channel region, and the ions for forming a buried layer for preventing punchthrough are implanted in a deep portion of the silicon semiconductor substrate 101 (illustration omitted).

Then, pyrogenic oxidation is carried out at a temperature condition of 850° C. by using a gas mixture of $H_2$ and $O_2$. The gate oxide film 103 is formed on the region of the silicon substrate 101 sectioned by the field oxide film 102 with a thickness of for example 5 nm. A structure shown in FIG. 5A is obtained as described above.

Figure 5B:
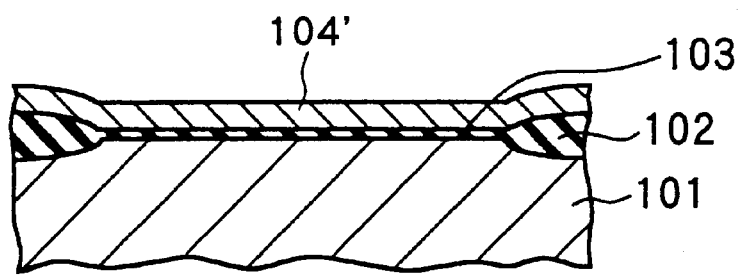

Thereafter, as shown in FIG. 5B, the $WSi_x$ film 104 of the gate electrode is stacked to about 100 nm. The $WSi_x$ (film) 104 is formed by a low pressure chemical vapor deposition (LP-CVD) process under the following silicon-rich ($WSi_x$: x=3.0) conditions in an $SiH_2C_2$+WF6 reaction system so as not to conspicuously cause deterioration of the bonding and gate withstand voltage even if directly stacked on the gate oxide film 103.

Conditions for Forming $WSi_x$ film 104

Film forming device: Cold-Wall type LP-CVD device

Film forming temperature: 600° C.

Film forming pressure: 40 Pa

Film forming gas (flow rate): $SiH_2Cl_2$/$WF_6$/Ar=160/1.6/100 sccm

Note that, as the tungsten silicide represented by $WSi_x$ (x represents any number of 1 to 3), for example, $W_2Si_3$, $WSi_2$, $WSi_3$, etc. have been known.

Figure 5C:
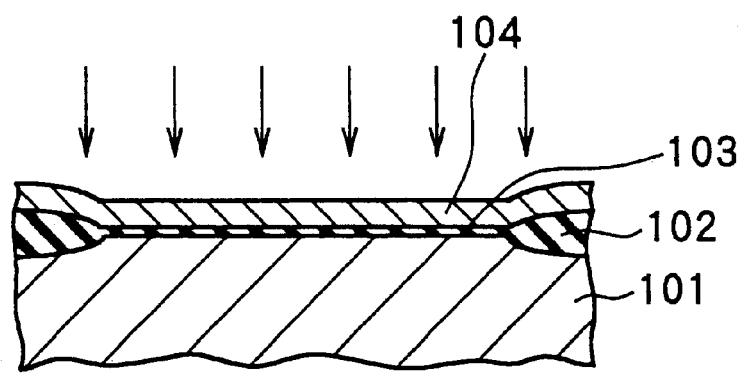

Then, as shown in FIG. 5C, oxygen ions ($O_2^+$ ions) are implanted into the entire surface under the conditions of an acceleration energy of 15 keV and a dosage of $5 \times 10^{14}$/$cm^2$ in order to suppress the grain growth of the $WSi_x$ film 104. The ions are implanted at this time so that the range of flight of the $O_2^+$ ions is in the $WSi_x$ film 104.

Figure 5D:
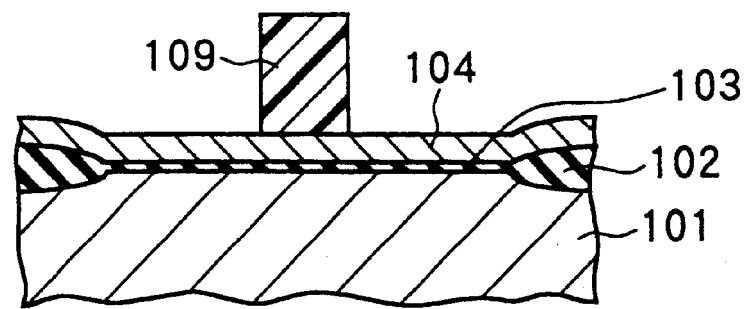

Further, as shown in FIG. 5D, a photoresist 109 is coated on the entire surface, patterning is carried out, and a resist pattern of the gate electrodes copying the gate electrode pattern is formed.

Figure 6A:
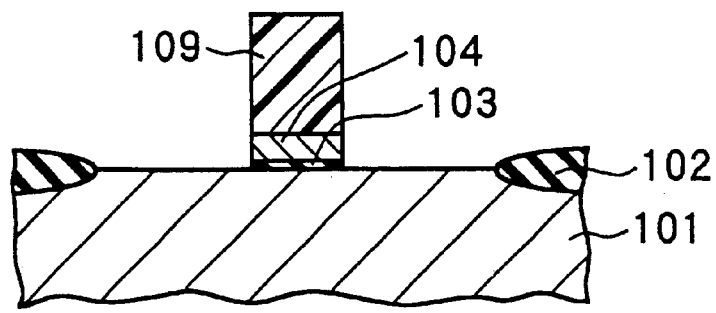
FIGS. 6A to 6D are sectional views of principal steps of a method for producing a semiconductor device of the present invention.

Next, as shown in FIG. 6A, the $WSi_x$ film 104 is etched with this pattern formed resist 109 as a mask to form the gate electrodes.

The etching conditions at this time are for example as follows:

Etching device: ECR (electron cyclotron resonance) plasma etching device

Etching temperature: 20° C.

Pressure: 0.4 Pa

RF power: Step 1=80 W, Step 2=30 W

Gas flow rate: $Cl_2$/$O_2$=75/5 sccm

Figure 6B:
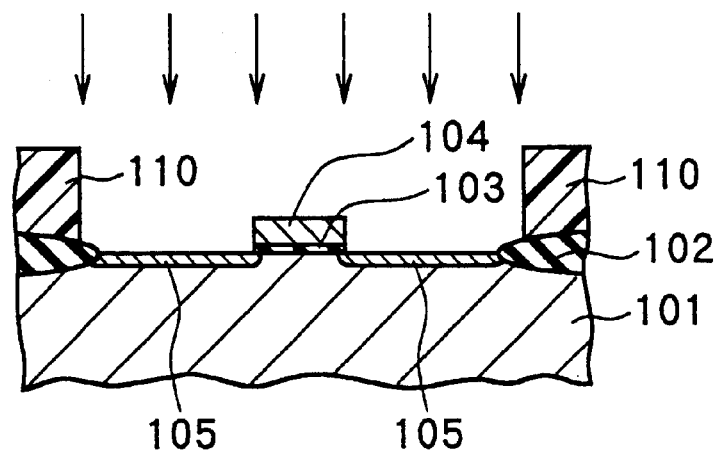

Then, as shown in FIG. 6B, for example the p-type impurity $BF_2^+$ is implanted with an acceleration energy of about 20 keV and a dosage of about $3 \times 10^{15}$/$cm^2$ into the region of the n-type silicon semiconductor substrate 101 sectioned by the field oxide film 102 at the peripheral area below the gate electrodes using the resist mask 110 and the gate electrode 104 as a mask. Thereafter, heat treatment is carried out for 30 minutes at 850° C. in an $N_2$ atmosphere, then the impurity is activated so as to form a p-type impurity diffusion region (source and drain region) 105.

Figure 6C:
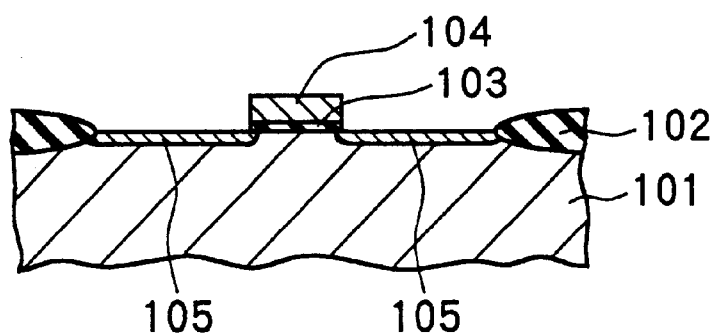
Figure 6D:
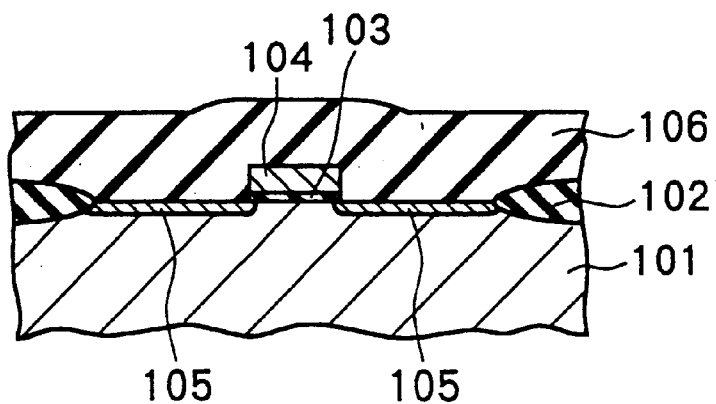

Thereafter, as shown in FIG. 6C, the resist mask 110 is removed and, as shown in FIG. 6D, the low pressure CVD process using for example $O_2$-TEOS (tetraethylorthosilicate) is used to stack the inter-layer insulating film 106 over the entire surface.

Further, contact holes reaching the p-type impurity diffusion region 105 are opened in the inter-layer insulating film 106 and a metal such as tungsten or aluminum is buried in the contact holes to form the contact plugs 110. The interconnection layer 111 made of aluminum or the like is then sequentially formed to produce a semiconductor device having the p-channel MOS transistor as shown in FIG. 3A.

According to the present embodiment, the $WSi_x$ film 104 of the gate electrode doped with oxygen in a dosage of $5 \times 10^{14}$/$cm^2$ (about $5 \times 10^{19}$/$cm^3$ in concentration) can be formed conveniently and with a good yield. Further, the grain size of this $WSi_x$ film 104 can be suppressed to a size of about 20 nm at the maximum even after heat treatment (annealing after ion implantation) at for example 850° C. for 30 minutes. Accordingly, a semiconductor device having a MOS transistor with a high reliability in which the gate insulation layer dielectric breakdown and the reduction of the gate capacity are suppressed can be produced.

Eighth Embodiment

The present embodiment is an example of producing the semiconductor device of the second embodiment. In the seventh embodiment, the oxygen ions are uniformly implanted into the $WSi_x$ film on the gate oxide film, but in the present embodiment, the concentration of the oxygen ions contained in the $WSi_x$ film constituting the gate electrode is varied in the depth direction.

Figure 7A:
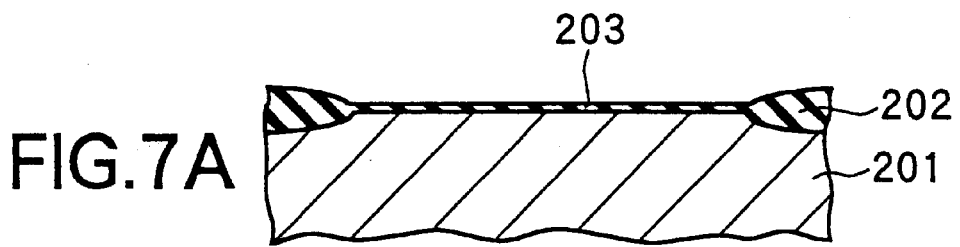
FIGS. 7A to 7D are sectional views of principal steps of a method for producing a semiconductor device of the present invention.

First, as shown in FIG. 7A, similar to the first embodiment, a field oxide film 202 is formed to a thickness of about 400 nm on the p-type silicon semiconductor substrate 201 by the LOCOS process for wet oxidation at for example 950° C.

Then, ions for the threshold voltage (Vth) adjustment are implanted in the surface layer portion of the active region forming the source and drain region and the channel region, and ions for forming the buried layer for preventing punch-through are implanted at the deep portion of the silicon semiconductor substrate 201 (illustration omitted).

Then, the pyrogenic oxidation is carried out at the temperature condition of 850° C. by using the gas mixture of, and the gate oxide film 203 is formed on the region sectioned by the field oxide film 202 of the silicon substrate 201 with a thickness of for example 5 nm. A structure shown in FIG. 7A is obtained as described above.

Figure 7B:
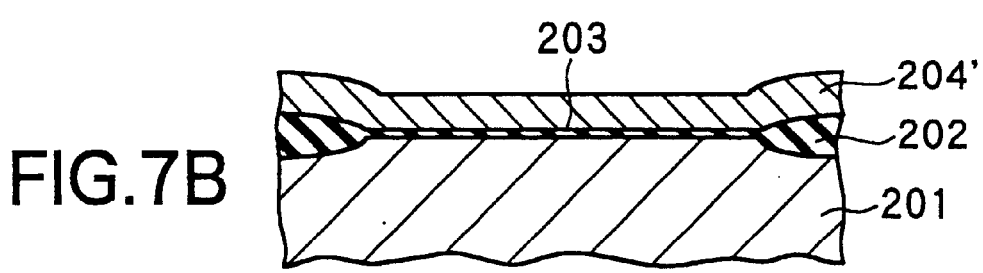

Then, as shown in FIG. 7B, the CVD process using $SiH_2Cl_2$–$WF_6$ is used to form a $WSi_x$ film 204' stacked on the gate oxide film 203 to a thickness of 100 nm. Thereafter, the oxygen ions are implanted in the $WSi_x$ film 204' so that the concentration of oxygen ions varies in the thickness direction (depth direction).

The ion implantation process can accurately control the energy and dosage of the ion implantation when the impurity is implanted and can determine the position of ions to be implanted by adjusting the energy (that is, it is determined to how deep a position from the surface on the ion implantation side the impurity ions are implanted). Further, by adjusting the dosage of the ion implantation, the concentration of the impurity to be doped can be adjusted.

In the present embodiment, the oxygen ions are implanted under for example the following conditions:

First, the oxygen ions are implanted within the range of about 10 nm in an upward direction from the gate oxide film boundary surface of the part in contact with the gate oxide film of the $WSi_x$ film 204' so that the oxygen concentration becomes $1\times10^{17}/cm^3$ or less (formation of the $WSi_x$ film 204a).

Then, the oxygen ions are implanted in the $WSi_x$ film having a thickness of about 30 nm in the center region located within the range of 10 to 40 nm in the upward direction from the gate oxide film boundary surface of the $WSi_x$ film 204' so that the oxygen concentration becomes about $5\times10^{19}/cm^3$ (formation of the $WSi_x$ film 204b).

Finally, the ions are implanted in the $WSi_x$ film 204' within the range of about 60 nm on this so that the oxygen concentration becomes about $1\times10^{17}/cm^3$ or less formation of the $WSi_x$ film 204c).

Figure 7C:
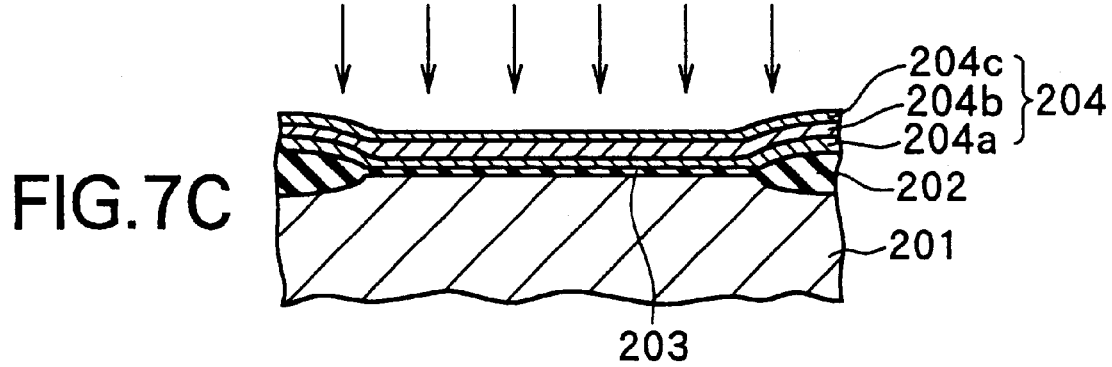

As described above, as shown in FIG. 7C, an $WSi_x$ film 204 is obtained containing oxygen so that the oxygen concentration varies in the thickness direction (depth direction).

Figure 7D:
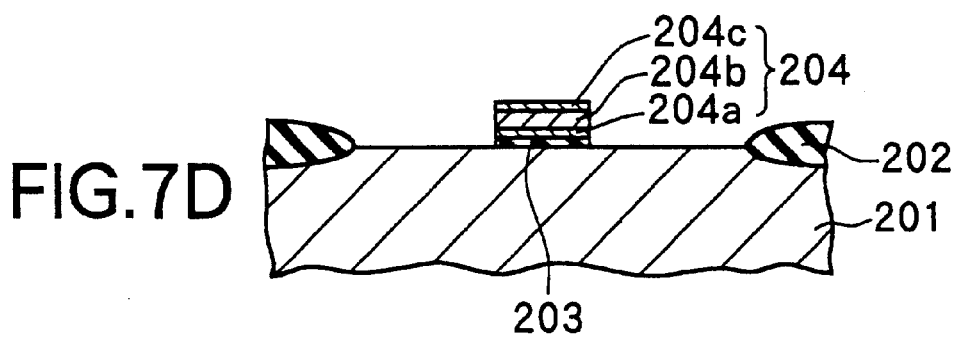

Next, similar to the seventh embodiment, a not illustrated photoresist is coated on the entire surface and then patterned to form a resist pattern of gate electrodes copying the gate electrode pattern. Further, the $WSi_x$ film 204 is etched with this pattern-formed resist 109 as a mask to form the gate electrodes. A structure shown in FIG. 7D is obtained in the above way.

Thereafter, a similar process as that of the seventh embodiment is followed to produce the semiconductor device as shown in FIG. 3B.

According to the present embodiment, the grain growth of the $WSi_x$ film 204a in the vicinity in contact with at least the gate oxide film 203 of the $WSi_x$ film 204 can be suppressed while holding the boundary surface characteristic between the $WSi_x$ film 204 and the gate oxide film 203 of the underlying layer.

Namely, in the center region ($WSi_x$ film 204b) in which the oxygen concentration is relatively high, i.e., $5\times10^{19}/cm^3$, the grain growth of the $WSi_x$ is obstructed due to the influence of the oxygen. Further, in the $WSi_x$ film 204a of the part (lower region) in contact with the gate oxide film in which the oxygen concentration is relatively low, the grain growth in the thickness direction is restricted, so the grain growth can be suppressed.

Further, in the region with the thickness of 60 nm of the $WSi_x$ film 204c located in the uppermost layer (upper region) of the gate electrode, the impurity concentration of oxygen is relatively low (it is not necessary to raise the oxygen concentration) and the thickness is relatively large, so the grains are also relatively large and grow to a size of about 50 nm, but the growth of the $WSi_x$ film 204c in this part does not assist the deterioration of the gate insulation withstand voltage and the reduction of the gate capacity and only contributes to the reduction of the resistance of the gate electrodes.

Accordingly, according to the present embodiment, a semiconductor device having a MOS transistor with an extremely high reliability in which the gate insulation dielectric breakdown and the reduction of the gate capacity are further suppressed can be produced.

Ninth Embodiment

The ninth embodiment is an example of production of the semiconductor device shown in the fourth embodiment. Below, the method of production of the semiconductor device of the present embodiment will be explained by referring to the drawings.

Figure 8A:
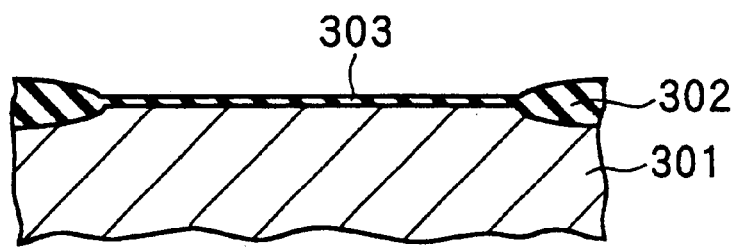
FIGS. 8A to 8D are sectional views of principal steps of a method for producing a semiconductor device of the present invention.

First, as shown in FIG. 8A, a field oxide film 302 is formed on an n-type silicon semiconductor substrate 301 to a thickness of about 400 nm by the LOCOS process for wet oxidation at for example 950° C.

Next, ions for the threshold voltage (Vth) adjustment are implanted at the surface layer portion of the active region forming the source and drain region and the channel region, and ions for forming the buried layer for preventing the punchthrough are implanted at the deep portion of the silicon semiconductor substrate 301 (illustration omitted).

Next, pyrogenic oxidation is carried out under temperature conditions of 850° C. by using a gas mixture of $H_2$ and $O_2$ to form a gate oxide film 303 on the region of the silicon substrate 301 sectioned by the field oxide film 302 to a thickness of for example 4 nm.

Figure 8B:
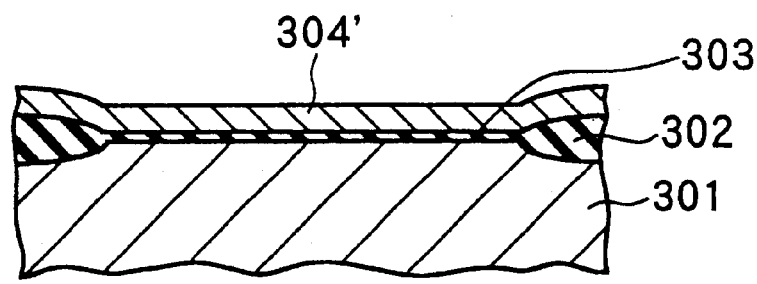

Then, as shown in FIG. 8B, a $WSi_x$ film 304' is formed on the gate oxide film 303 to a thickness of about 100 nm. This $WSi_x$ film 304' must be formed under silicon-rich ($WSi_x$: x=3.0) conditions in the reaction system of $SiH_2Cl_2+WF_6$ so as not to conspicuously cause the deterioration of the bonding and gate withstand voltage even if the $WSi_x$ film 304' is directly stacked on the gate oxide film 303.

Figure 8C:
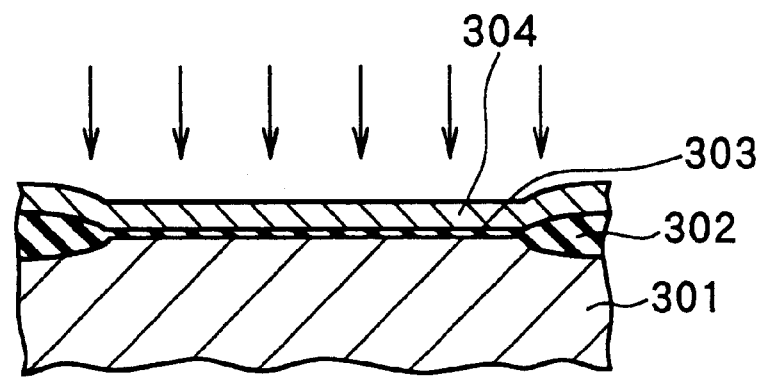

Next, the impurity is doped into the $WSi_x$ film. The doping of the impurity is effectively carried out before the application of the heat treatment at first after stacking the WSi$_x$. Most preferably, it is doped in-situ when the WSi$_x$ is stacked. In the present embodiment, the boron is uniformly doped in the thickness direction of the WSi$_x$, and the nitrogen is doped after the formation of the WSi$_x$ film. For example, under the following conditions, an Si$_x$ film doped with the boron in-situ is formed:

Film forming device: Cold-Wall type LP-CVD device
Film forming temperature: 680° C.
Film forming pressure: 40 Pa
Film forming gas (flow rate): SiH$_2$Cl$_2$/WF$_6$/B$_2$H$_6$/Ar= 160/1.6/0.5/100 sccm Then, as shown in FIG. 8C, nitrogen ions are implanted into the entire surface under conditions of for example an energy of 20 keV and a dosage of 5×10$^{15}$/cm$^2$. At this time, the range of flight of the nitrogen ions must be in the WSi$_x$ film.

Figure 8D:
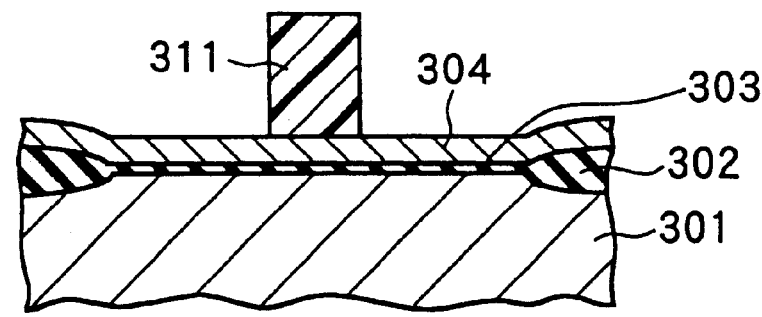
Figure 9A:
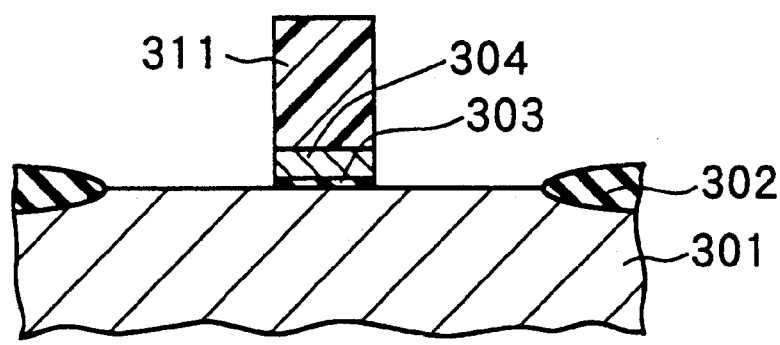
FIGS. 9A to 9C are sectional views of principal steps of a method for producing a semiconductor device of the present invention.

Thereafter, as shown in FIG. 8D, a resist pattern 311 of the gate electrodes is formed, then, as shown in FIG. 9A, the resist pattern 311 is used as a mask to process the WSi$_x$ film 304' under the following etching conditions to form the gate electrodes 304.

Figure 9B:
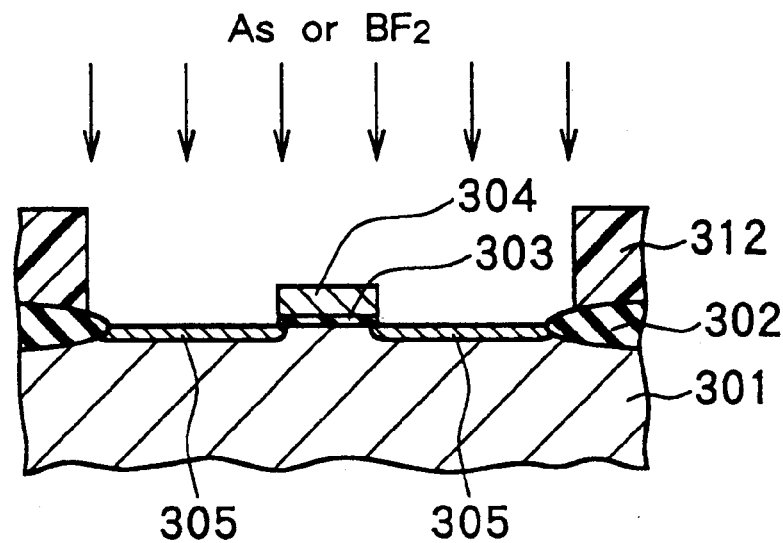

Etching Conditions of WSi$_x$
Etching device: ECR Plasma Etcher
Etching temperature: 20° C.
Etching pressure: 0.4 Pa
Rf Power: Step 1=80 W, Step 2=30 W
Etching gas: Cl$_2$/O$_2$=75/5 sccm Next, as shown in FIG. 9B, by doping the impurity into the peripheral area below the gate electrode of the region of the silicon substrate 301 sectioned by the field oxide film 302, the p-type impurity diffusion region 305 is formed. In the present embodiment, a PMOS transistor is formed, therefore, BF$_2^+$ ions are implanted with an acceleration energy of about 20 keV and a dosage of 3×10$^{15}$/cm$^2$.

In this case, when an NMOS transistor is formed, As ions can be implanted in place of BF$_2^+$ ions. Further, for example, where an n-channel MOS transistor and p-channel MOS transistor are formed on the same silicon substrate like a CMOS transistor, it is necessary to use a resist mask to separately implant impurity ions of different conductivity types in the regions for forming the n-channel MOS transistor and the p-channel MOS transistor.

Figure 9C:
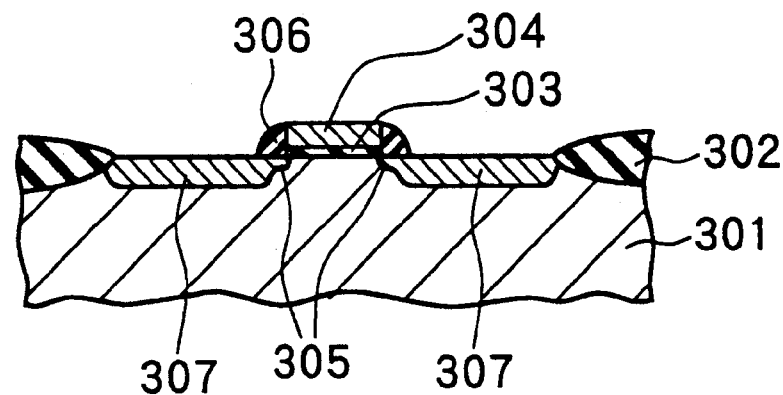

Next, as shown in FIG. 9C, silicon oxide film is stacked by the LP-CVD process using for example O$_2$-TEOS, then the side wall protection film 303 is formed by anisotropic etching.

Thereafter, the impurity is implanted in the peripheral area below the gate electrodes at the region of the silicon substrate 301 sectioned by the field oxide film 302 using the side wall protection film 303 as a mask. In the present embodiment, a PMOS transistor is formed, so as the condition of the ion implantation, for example, BF$_2^+$ ions are implanted with an acceleration energy of 10 to 30 keV and a dosage of 3×10$^{15}$/cm$^2$.

In this case, when an NMOS transistor is formed, As ions are implanted in place of BF$_2^+$ ions. Further, for example, where an n-channel MOS transistor and p-channel MOS transistor are formed on the same silicon substrate like in a CMOS, it is necessary to use a resist mask to separately implant impurity ions of different conductivity types in the regions for forming the n-channel MOS transistor and the p-channel MOS transistor.

Further, the impurity is diffused, then the impurity is activated under the following conditions in an N$_2$ atmosphere to form the source and drain region 307.

Heat Treatment Conditions of Activation
Device: Electric furnace annealing device
Temperature: 850° C.
Time: 30 minutes Then, by the usual process, an inter-layer insulating film 308 comprising three layers of a silicon oxide film, silicon nitride film, and boro-phosphosilicate glass (BPSG) (or non-doped silicate glass (NSG)) film is formed. For example, a silicon oxide film of a thickness of about 100 nm is stacked at a temperature of about 450° C. by a LP-CVD process using a gas mixture of SiH$_4$ and O$_2$, a silicon nitride film is formed on the silicon oxide film to a thickness of about 30 to 80 nm at a temperature of 760° C. by the LP-CVD process using a gas mixture of for example SiH$_2$Cl$_2$ and NH$_3$, and further a BPSG film or NSG film is formed on this silicon nitride film to a thickness of about 250 nm at a temperature of about 700° C. by the low pressure CVD process using a gas mixture of for example O$_2$ and TEOS, whereby an inter-layer insulating film 308 comprising three layers can be obtained.

Thereafter, a not illustrated resist pattern for forming the contact holes is formed on the inter-layer insulating film 308, then the BPSG (or NSG) film, silicon nitride film, and silicon oxide film are sequentially etched by anisotropic etching using the resist pattern as a mask, whereby not illustrated contact holes reaching the source and drain region 307 are opened. Then, these contact holes are buried with tungsten by for example the CVD process to form the connection plugs 309, then an interconnection layer 310 made of aluminum or the like is formed on this and other steps gone through to produce the semiconductor device as shown in FIG. 4A.

In the above way, a semiconductor device having a gate electrode made of WSi$_x$ containing boron and nitrogen as impurities can be produced conveniently and with a good yield. The semiconductor device of the present embodiment is a semiconductor device having a MOS transistor with a high reliability in which gate insulating film dielectric breakdown and the reduction of the gate capacity are further suppressed since it has the gate electrodes formed of WSi$_x$ containing boron and nitrogen as impurities.

Particularly, in the present embodiment, when stacking WSi$_x$, the boron is doped in-situ, therefore it becomes possible to dope this so that the concentration becomes uniform in the depth direction in comparison with the case where this is doped by ion implantation.

10th Embodiment

Figure 10A:
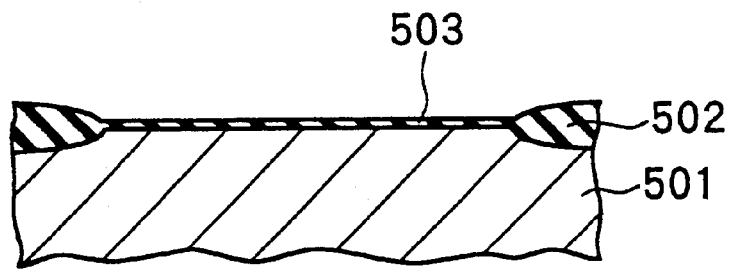
FIGS. 10A to 10C are sectional views of principal steps of a method for producing a semiconductor device of the present invention.

The 10th embodiment is an example of the method of production of the semiconductor device shown in the fifth embodiment. First, after going through similar processes to those of the ninth embodiment, as shown in FIG. 10A, a gate oxide film 503 is formed on a region of an n-type silicon semiconductor substrate 501 separated by a field oxide film 502.

Then, by combining the following conditions, a WSi$_x$ film containing nitrogen and varying in concentration in the thickness direction (depth direction) is stacked on the gate insulating film.

Figure 10B:
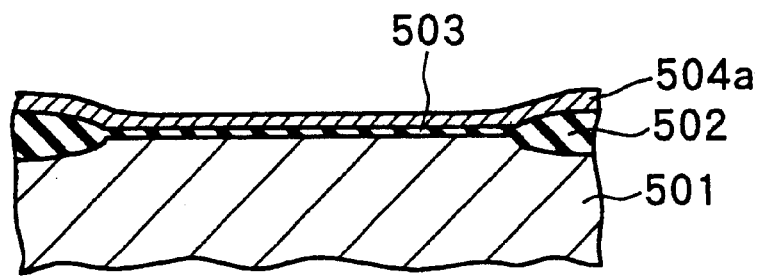
Figure 10C:
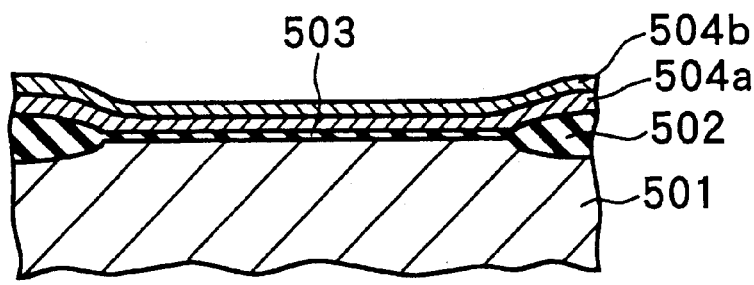

As the first step, as shown in FIG. 10B, a WSi$_x$ film 504a is formed under the following conditions:

Film forming device: Cold-Wall type LP-CVD device
Film forming temperature: 680° C.
Film forming pressure: 40 Pa
Film forming gas (flow rate): SiH$_2$Cl$_2$/WF$_6$/B$_2$H$_6$/Ar= 160/1.6/0.5/100 sccm As the second step, as shown in FIG. 10C, a WSi$_x$ film 504b is formed under the following conditions:

Film forming device: Cold-Wall type LP-CVD device

Film forming temperature: 680° C.

Film forming pressure: 40 Pa

Figure 11A:
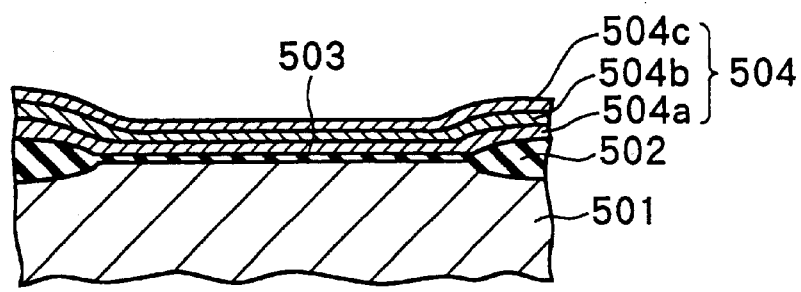
FIGS. 11A to 11C are sectional views of principal steps of a method for producing a semiconductor device of the present invention.

Film forming gas (flow rate): $SiH_2Cl_2/WF_6/B_2H_6/Ar/NH_3$=160/1.6/0.5/100/1.0 sccm As the third STEP, as shown in FIG. 11A, a $WSi_x$ film 504c is formed under the following conditions:

Film forming device: Cold-Wall type LP-CVD device

Film forming temperature: 680° C.

Film forming pressure: 40 Pa

Film forming gas (flow rate): $SiH_2Cl_2/WF_6/B_2H_6/Ar$= 160/1.6/0.5/100 sccm

Figure 11B:
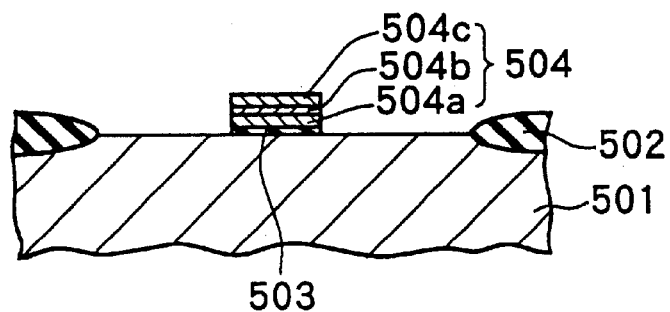

Further, a not illustrated resist pattern for forming the gate electrodes is formed and the $WSi_x$ films 504a and 504b and 504c are etched similar to the ninth embodiment to form the gate electrodes as shown in FIG. 11B.

Figure 11C:
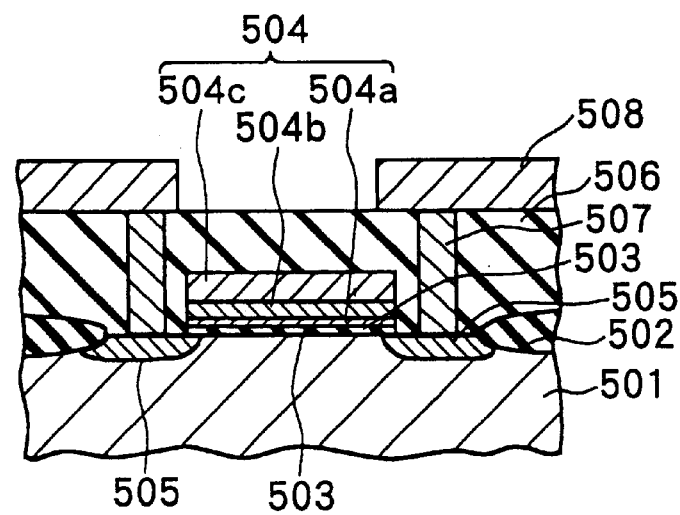

Thereafter, while the illustration of the steps is omitted, in the same way as in the ninth embodiment, a p-type impurity is diffused in the peripheral area below the gate electrodes of the silicon semiconductor substrate 501 by the ion implantation process, then activated by applying heat treatment (annealing), whereby the source and drain region 505 is formed. An inter-layer insulating film 506 is formed on the entire surface, then contact holes reaching the source and drain region 505 are formed in the inter-layer insulating film 506 and are buried by a conductive material such as tungsten to form the contact plugs 507. An interconnection layer 508 made of aluminum or the like is formed on this, whereby the semiconductor device as shown in FIG. 11C can be produced.

In the present embodiment, as the method of nonuniformly doping the impurity obstructing the grain growth of $WSi_x$ in the depth direction of the $WSi_x$ film 504, the CVD steps are changed (first step->second step->third step) and the impurity profile is controlled to mix in the impurity. By forming the $WSi_x$ film while varying the nitrogen concentration in the depth direction in this way, the grain growth of $WSi_x$ is obstructed in the center region (504b) of the $WSi_x$ film 504. By the restriction of the grain growth in the depth direction thereof, the grain growth in the $WSi_x$ film 504a can be suppressed near the boundary surface (504a) with the thermal oxide film 503 of the lower region thereof while maintaining the bonding and work function in a state not influenced by the mixing of this impurity (while holding an excellent boundary surface characteristic). Further, in the upper layer part (upper region 504c) of the $WSi_x$ film 504, the grains of the $WSi_x$ film grow large without being influenced by the impurity, but this influence is not exerted near the boundary surface (504a) with the thermal oxide film 503, so a $WSi_x$ film 504c with a low resistance is obtained.

Accordingly, the semiconductor device of the present embodiment has a MOS transistor with a high reliability in which gate insulation dielectric breakdown and the reduction of the gate capacity are suppressed.

Note that, in the present embodiment, the concentration of the nitrogen contained in the $WSi_x$ film is varied in the depth direction according to whether or not $NH_3$ is added to the gas composition in the CVD step, but it is also possible to form the $WSi_x$ film so that the concentration of the nitrogen contained in the $WSi_x$ film continuously varies in the thickness direction by continuously changing the flow rate of the $NH_3$.

11th Embodiment

In the present embodiment, it is checked how the withstand voltage characteristic of the gate oxide film varies when changing the content of the nitrogen as the impurity in the $WSi_x$ film when forming a gate oxide film on a silicon semiconductor substrate and further forming an $WSi_x$ film on the gate oxide film.

Namely, a gate oxide film of a thickness of 4.0 nm was formed on a silicon semiconductor substrate, a $WSi_x$ film with a thickness of 70 nm was formed on this, $N_2^+$ ions were implanted with a predetermined dosage into the $WSi_x$ film, then heat treatment was carried out at 850° C. for 30 minutes, then the gate electrodes were formed by the etching process and the withstand voltage characteristics of the gate oxide film were checked.

The results are shown in FIG. 12. In FIG. 12, the ordinate represents a cumulative failure (×100%), and the abscissa represents the gate withstand voltage, that is, the "time zero dielectric breakdown voltage (TZDB (V))". Further, the curve a indicates a case where the nitrogen ions were not implanted, b indicates a case where nitrogen ions were implanted with a dosage of $5\times10^{15}/cm^2$, c indicates a case where nitrogen ions were implanted with a dosage of $7.5\times10^{15}/cm^2$, and d indicates a case where nitrogen ions were implanted with a dosage of $1\times10^{16}/cm^2$.

It is seen from FIG. 12 that excellent gate withstand voltage characteristics are obtained in all cases where nitrogen ions are implanted in comparison with the case where nitrogen ions are not implanted.

12th Embodiment

In the 12th embodiment, it is checked how the withstand voltage characteristics of the gate oxide film vary when doping the nitrogen uniformly as the impurity in the $WSi_x$ film and changing the content of the boron when forming a gate oxide film on a silicon semiconductor substrate and further forming an $WSi_x$ film on the gate oxide film.

Namely, a gate oxide film of a thickness of 4.0 nm was formed on a silicon semiconductor substrate, an $WSi_x$ film of a thickness of 70 nm was formed on this, $N_2^+$ ions of a dosage of $5\times10^{15}/cm^2$ were implanted into the entire surface of the $WSi_x$ film, $B^+$ ions were implanted in various dosages, heat treatment was carried out at 850° C. for 30 minutes, then gate electrodes were formed by etching process and the withstand voltage characteristics of the gate oxide film were checked.

The results are shown in FIG. 13. In FIG. 13, the ordinate represents the cumulative failure (x 100%), and the abscissa represents the time zero dielectric breakdown (TZDB (V)). Further, the curve a indicates a case where the $B^+$ ions were not implanted, b indicates a case where $B^+$ ions were implanted with a dosage of $1\times10^{15}/cm^2$, c indicates a case where $B^+$ ions were implanted with a dosage of $3\times10^{15}/cm^2$, and d and e indicate cases where $B^+$ ions were implanted with dosages of $5\times10^{15}/cm^2$. d and e are results of experiments carried out by using two wafers under the same conditions.

As shown in FIG. 13, it was seen that almost the same results were obtained and there was reproducibility.

Further, it was seen from FIG. 13 that excellent time zero dielectric breakdown characteristics were obtained in all cases where the nitrogen ions and the $B^+$ ions were implanted in comparison with the case where only the nitrogen ions were implanted.

Summarizing the effects of the invention, as explained above, the semiconductor devices of the first and second aspects of the invention are characterized in that a part of the conductive layer (preferably gate electrode) in contact with at least the insulating film (preferably gate insulating film) is made of a conductive material (preferably refractory metal silicide or refractory metal) having a work function near the substantive center of the energy band gap of the substrate material and in that the conductive material contains an impurity.

Accordingly, the semiconductor devices of the first and second aspects of the invention are semiconductor devices having conductive layers (gate electrodes) in which a so-called short channel effect is suppressed and the operating speed of the device is maintained. In addition, they are semiconductor devices in which the dielectric breakdown of the insulating film of the lower layer accompanied the grain growth of the refractory metal silicide, the refractory metal or other conductive material or in a MOSTr the dielectric breakdown of the insulating film (gate insulating film) and the reduction of the gate capacity, which have been problems of the related art, are suppressed.

Further, when the conductive material of the conductive layer of the semiconductor device of the present invention contains two or more types of impurities, it is possible to more effectively suppress the grain growth of the conductive material in comparison with the case where one type of impurity is doped. Accordingly, even in a case where a thinner insulating film (for example, gate insulating film having a thickness of about 4 nm) is formed, the result is a semiconductor device having a conductive layer (gate electrodes) with excellent reliability without causing the deterioration of the insulation withstand voltage.

Further, according to the methods of production of semiconductor devices of the third and fourth aspects of the invention, a semiconductor device can be produced having a conductive layer (gate electrodes) in which the short channel effect is suppressed and the operating speed of the device is maintained without adding any change to the conditions of the heat treatment step and the impurity doping step after this and without causing a reduction of the insulation withstand voltage and the reduction of the gate capacity.

Further, by doping the impurity nonuniformly in the depth direction of the conductive layer, preferably so that the concentration of the center portion with respect to the depth direction of the conductive layer becomes relatively high and the concentration of the upper and lower regions thereof becomes relatively low, a MOSTr having a similar insulating film boundary surface characteristic to that of the case where the impurity is not doped can be formed. Accordingly, according to the methods of production of the semiconductor devices of the present invention, the degree of freedom of the process design of the semiconductor device will not be lowered.

Further, where there is a step for doping the impurity into the conductive layer by the ion implantation process, the impurity can be implanted with the correctly controlled acceleration energy and dosage.

Accordingly, according to the present invention, the degree of integration of the LSI can be improved, the drive capability of the MOSTr can be improved according to the design rule, and high speed operation of the device becomes possible.

What is claimed is:

1. A semiconductor device comprising:
    a substrate;
    an insulating film formed in the substrate; and
    a conductive layer formed on the insulating film and having at least a part in contact with the insulating film made of a conductive material having a work function near a substantial center of an energy band gap of the substrate material and containing a predetermined amount of impurity, wherein the impurity is oxygen, nitrogen or boron.

2. A semiconductor device set forth in claim 1, wherein the impurity is an impurity suppressing the grain growth of the conductive material.

3. A semiconductor device as set forth in claim 1, wherein the conductive layer has the layer comprised of said conductive material with containing an impurity having different concentrations in a depth direction and having the work function near the substantial center of the energy band gap of the substrate material.

4. A semiconductor device as set forth in claim 1, wherein the conductive layer has a refractory metal silicide layer or a refractory metal layer containing an impurity with different concentrations in a depth direction.

5. A semiconductor device as set forth in claim 1, wherein the conductive layer has a layer comprised of said conductive material with a center region with respect to a depth direction thereof containing an impurity having a higher concentration than those of upper and lower regions thereof having the work function near the substantial center of the energy band gap of a substrate material.

6. A semiconductor device as set forth in claim 1, wherein the conductive layer has a refractory metal silicide layer or a refractory metal layer with a center region with respect to a depth direction thereof containing an impurity having a higher concentration than those of upper and lower regions thereof.

7. A semiconductor device as set forth in claim 1, wherein the substrate material is silicon and the conductive material is a refractory metal silicide or a refractory metal.

8. A semiconductor device comprising:
    a substrate;
    an insulating film formed in the substrate; and
    a conductive layer formed on the insulating film and having at least a part in contact with the insulating film made of a conductive material having a work function near a substantial center of an energy band gap of the substrate material and containing a predetermined amount of impurity, wherein the conductive layer contains two or more types of impurities.

9. A semiconductor device as set forth in claim 8, wherein at least one of the two or more types of impurities is oxygen, nitrogen, or boron.

10. A semiconductor device as set forth in claim 8, wherein the conductive layer contains each of the two or more types of impurities in concentrations of $1 \times 10^{19}/cm^3$ to $1 \times 10^{21}/cm^3$.

11. A semiconductor device comprising:
    a substrate;
    an insulating film formed in the substrate; and
    a conductive layer formed on the insulating film and having at least a part in contact with the insulating film made of a conductive material having a work function near a substantial center of an energy band gap of the substrate material and containing a predetermined amount of impurity,
    wherein the substrate material is silicon and the conductive material is a refractory metal silicide or a refractory metal, and
    wherein the refractory metal silicide is one, two or more types selected from a group consisting of tungsten silicide ($WSi_x$), molybdenum silicide ($MoSi_x$), tantalum silicide ($TaSi_x$), and titanium silicide ($TiSi_x$).

12. A semiconductor device as set forth in claim 11, wherein the refractory metal is one, two or more types selected from a group consisting of tungsten (W), tantalum (Ta), and titanium (Ti).

13. A semiconductor device comprising:
    a silicon substrate;
    a gate insulating film formed in the silicon substrate; and a gate electrode formed on the gate insulating film and having at least a part in contact with the gate insulating film made of a refractory metal silicide layer containing an impurity or a refractory metal layer containing an impurity, wherein the refractory metal silicide or the refractory metal contains an impurity with different concentrations in a depth direction.

14. A semiconductor device as set forth in claim 13, wherein the refractory metal silicide layer or the refractory metal layer contains an impurity having a higher concentration in a center region with respect to a depth direction thereof than those of upper and lower regions thereof.

15. A semiconductor device comprising:

a silicon substrate;

a gate insulating film formed in the silicon substrate; and a gate electrode formed on the gate insulating film and having at least a part in contact with the gate insulating film made of a refractory metal silicide layer containing an impurity or a refractory metal layer containing an impurity, wherein the impurity is oxygen, nitrogen, or boron.

16. A semiconductor device as set forth in claim 15, wherein the impurity is an impurity suppressing the grain growth of the refractory metal silicide or the refractory metal.

17. A semiconductor device comprising:

a silicon substrate;

a gate insulating film formed in the silicon substrate; and a gate electrode formed on the gate insulating film and having at least a part in contact with the gate insulating film made of a refractory metal silicide layer containing an impurity or a refractory metal layer containing an impurity, wherein the refractory metal silicide layer or the refractory metal layer contains two or more types of impurities.

18. A semiconductor device as set forth in claim 17, wherein at least one of the two or more types of impurities is oxygen, nitrogen, or boron.

19. A semiconductor device as set forth in claim 17, wherein the refractory metal silicide layer or the refractory metal layer contains each of the two or more types of impurities in concentrations of $1 \times 10^{19}/cm^3$ to $1 \times 10^{21}/cm^3$.

20. A semiconductor device comprising:

a silicon substrate;

a gate insulating film formed in the silicon substrate; and a gate electrode formed on the gate insulating film and having at least a part in contact with the gate insulating film made of a refractory metal silicide layer containing an impurity or a refractory metal layer containing an impurity, wherein the refractory metal silicide is one, two or more types selected from a group consisting of tungsten silicide ($WSi_x$), molybdenum silicide ($MoSi_x$), tantalum silicide ($TaSi_x$), and titanium silicide ($TiSi_x$).

21. A semiconductor device as set forth in claim 20, wherein the refractory metal is one, two or more types selected from a group consisting of tungsten (W), tantalum (Ta), and titanium (Ti).

* * * * *